United States Patent [19]

Flament et al.

[11] Patent Number: 5,511,008
[45] Date of Patent: Apr. 23, 1996

[54] PROCESS AND APPARATUS FOR EXTRACTING A USEFUL SIGNAL HAVING A FINITE SPATIAL EXTENSION AT ALL TIMES AND WHICH IS VARIABLE WITH TIME

[75] Inventors: Bruno Flament, Grenoble; Roland Blanpain, Entre-Deux-Guiers, both of France

[73] Assignee: Commissariat a l'Energie Atomique, Paris, France

[21] Appl. No.: 161,787

[22] Filed: Dec. 3, 1993

[30] Foreign Application Priority Data

Dec. 14, 1992 [FR] France ................... 92 15027

[51] Int. Cl.$^6$ ................... H03H 21/00
[52] U.S. Cl. ................... 364/572; 364/574; 367/21; 367/22; 367/43; 367/117; 324/76.31; 324/76.33
[58] Field of Search ................... 364/572, 574, 364/484; 324/76.31, 33; 342/162, 150, 17, 20, 16, 424, 458, 352, 357, 192; 367/20–24, 38, 901, 73–76, 56, 57, 117

[56] References Cited

U.S. PATENT DOCUMENTS

| | | | |
|---|---|---|---|
| 4,228,395 | 10/1980 | Dusheck, Jr. et al. | 324/76.24 |
| 4,513,383 | 4/1985 | Hackett, Jr. | 342/16 |
| 4,654,835 | 3/1987 | Feintuch | 367/117 |
| 4,853,902 | 8/1989 | Corrigan | 367/44 |
| 4,890,264 | 12/1989 | Crews et al. | 367/43 |
| 5,030,913 | 7/1991 | Byram | 324/244 |
| 5,117,401 | 5/1992 | Feintuch | 367/135 |
| 5,132,691 | 7/1992 | Hauschultz | 342/159 |
| 5,209,237 | 5/1993 | Rosenthal | 367/45 |
| 5,255,210 | 10/1993 | Gardner et al. | 364/574 |
| 5,278,777 | 1/1994 | Cummins | 364/574 |
| 5,345,522 | 9/1994 | Vali et al. | 367/20 |

OTHER PUBLICATIONS

Widrow et al., Adaptive Noise Cancelling: Principles and Applications, Dec. 1975, pp. 1692–1716.
Schmidt, Multiple Emitter Location and Signal Parameter Estimation, Mar. 1986, pp. 276–280.
Flament et al., Weighted Beamforming for a Magnetic Network Detecting System, No date, pp. 1–6.
Marcos, Calibration of a Distorted Towed Array Using a Propagation Operator, 18 Dec. 1991, pp. 1987–1994.
Marcos et al., Source Localization Using A Distorted Antenna, 1989, pp. 2756–2759.
Fa–Long et al., Real–Time Implementation of "Propagator" Bearing Estimation Algorithm by Use of a Neural Network, Oct. 1992, pp. 320–325.
Widrow et al., Adaptive Antenna Systems, Dec. 1967, pp. 2143–2159.

*Primary Examiner*—Emanuel T. Voeltz
*Assistant Examiner*—Hal D. Wachsman
*Attorney, Agent, or Firm*—Cesari and McKenna

[57] ABSTRACT

A process for the extraction of a time-variable useful signal having a finite spatial extension by an array of N sensors or transducers (N being equal to or greater than 3), that receive the useful signal to which have been added q spatially coherent additive noises (q being less than N). According to the process, unprocessed signals are acquired on the output of each sensor, filtered in order to restrict them to the frequency band of the useful signal and digitized. Then, spatial prediction error signals of the noise are calculated and analyzed so as to carry out the detection of the useful signal and its separation from the q additive noises. A device for extracting a useful signal according to the process is also disclosed.

10 Claims, 8 Drawing Sheets

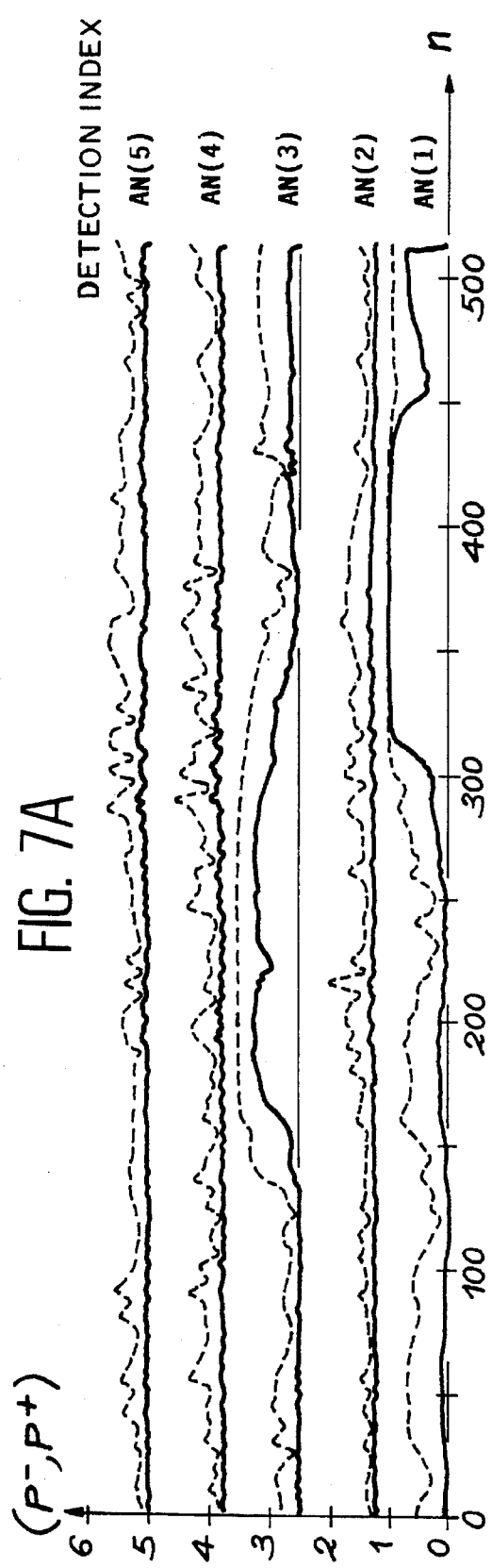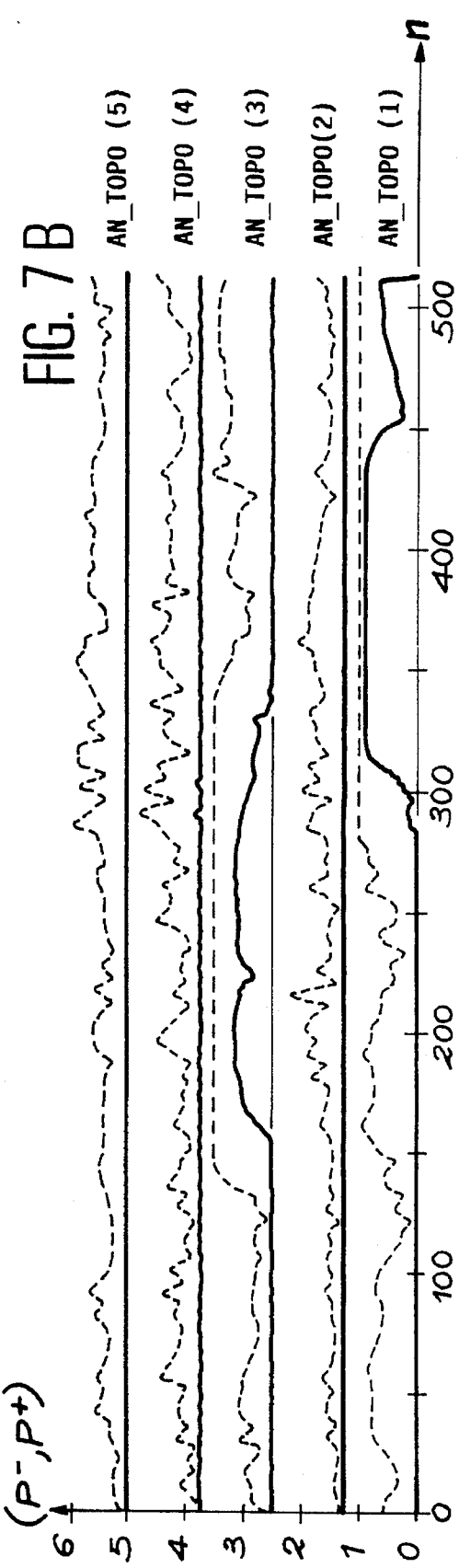

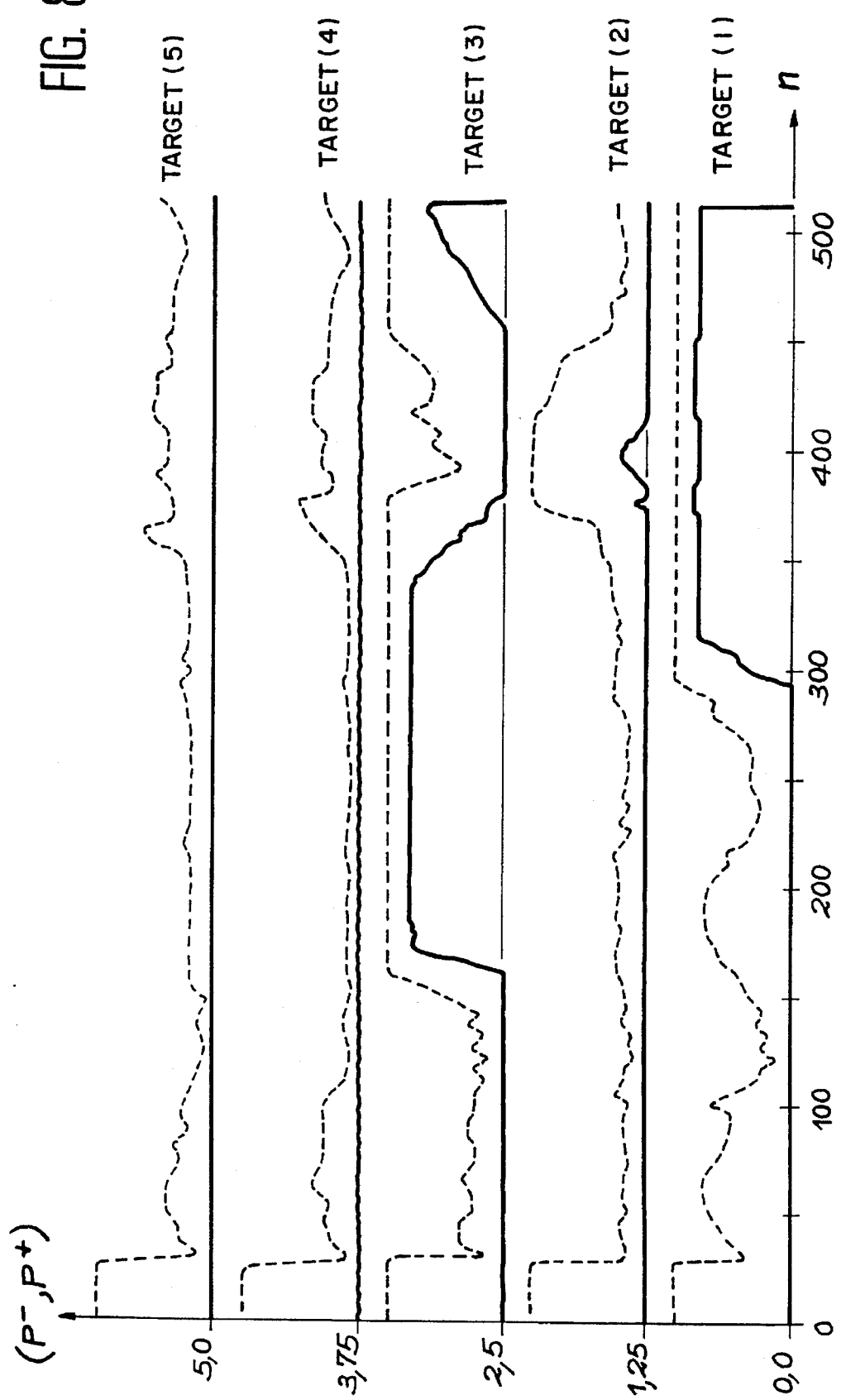

PROCESS AND APPARATUS FOR EXTRACTING A USEFUL SIGNAL HAVING A FINITE SPATIAL EXTENSION AT ALL TIMES AND WHICH IS VARIABLE WITH TIME

TECHNICAL FIELD

The present invention relates to a process and to a device for the extraction of a useful signal having a finite spatial extension at all times and which varies in time.

STATE OF THE ART

The prior art processes making it possible to extract a useful signal from a signal received by one or more sensors or transducers can be differentiated as a function of the number of sensors or transducers used. Thus, a distinction can be made between monodimensional processes and multidimensional processes with or without noise reference.

In monodimensional processes the information from a single sensor only makes it possible to use conventional filtering methods (time or frequency based). The coverage of a monitoring zone can only be obtained by moving the sensor, which can lead to difficultly solvable practical problems.

In particular, the environment close to the sensor can have an interfering effect, because it may be integrated into a transportation system The extraction of a useful signal is of an optimum nature (with a single signal) using the matched filtering method when the additive noise is white. This rarely fulfilled condition can be approached following a preliminary prewhitening operation. However, the filtering does not use the space coherence property of the noises and remains of a suboptimum nature compared with all multisensor methods which can make use of the spatial predictability properties of the noise.

Monodimensional processes can be illustrated by an application in the magnetic field. The methods and applications described in the Institut National Polytechnique de Grenoble Thesis of 1979 by R. Blanpain entitled "Real time processing of the signal from a magnetometer probe for the detection of magnetic anomalies" carry out a space—time recording of the magnetic field. A single sensor is moved over the area to be monitored. It records the geomagnetic noise, the geological noise (because the probe is moving rapidly here) and a possible useful signal. The well known method of matched filtering is then put into effect in order to eliminate in the best possible way the noises deteriorating the useful signal and perform a detection. This method is of an optimum nature in the case where the noise accompanying the signal is white, which is not the case here. Therefore, prior to any filtering, a prewhitening is necessary. However, prewhitening is difficult for reasons of the non-stationary nature of the noises. Thus, in practice the mean or auto-matching whitening filter only performs a suboptimum operation. Non-white geomagnetic noise residues remain and disturb the matched filtering operations.

In such monodimensional processes, the separation performed is consequently limited, because it cannot perform the spatial filtering in view of the fact that there is only one measuring sensor. The space coherence properties of the geomagnetic fluctuations are not used. This process can be effectively completed by the system proposed in the invention, which makes it possible to perform an effective filtering of the input unprocessed signals using their spatial properties.

There are numerous procedures in connection with multidimensional processes. They are combined within the general theory of processing multidimensional signals, e.g. in the article entitled "Models and processing of multidimensional signals" by J. L. Lacoume ("Traitement du Signal", vol. 5, no. 2, 1988). Consideration will be given to those which would appear to be representative and have an application in the solving of the problem defined hereinbefore. The case of magnetic detection illustrates the applications. The processes are classified in accordance with the presence of a "noise reference". Thus, the fact of knowing one or more sensors only recording noise is an advantage and use is made of this by noise subtraction methods. It is pointed out that up to now magnetic arrays or networks have not often been used and the following processing operations have been really employed on magnetic signals. Other fields such as sound detection/locating use them to a significant extent.

With noise references, said processes use an array of sensors called "noise reference", which only record noise, e.g. in the vicinity of the area to be monitored. It is necessary to have at least the same number of noise references as there are independent noises. The reference sensors are able to measure a physical phenomenon of a different nature to that of the useful signal (it is possible to filter a magnetic signal with the aid of a signal from e.g. a pressure sensor or transducer, if these two signals have a correlation). The transfer functions from the "noise reference" sensors to the useful signal sensors are identified. Therefore the noise is predicted and subtracted from the total signal. These noise subtraction processes are completely described in the article by D. Baudois, C. Servière and A. Silvent entitled "Noise subtraction—bibliographic analysis and synthesis" ("Traitement du Signal", vol. 6, no. 5, 1989).

They can only rarely be applied in the operational context for array detection, because they assume the knowledge of all the noise only sensors. This hypothesis is not made in the process according to the invention. The path or trajectory of the magnetic target is not known beforehand and the partitioning information of the sensors E is not available. It is also shown that noise subtraction does not withstand errors made in partitioning or subdividing the sensors into noise only sensors and useful sensors. Therefore such a process is not suitable for the set problem, but still remains of an optimum nature when the group of useful sensors $E_{su}$ and the group of noise sensors $E_{ref}$ are fixed and known a priori.

Without a noise reference, the second class of signal separation systems is still based on source independence and space coherence properties. When all the sensors receive the useful signal or all the noise only sensors are not known, a priori all the sensors have the same function. Conventional antenna processing processes make it possible to carry out a filtering of the sum of the spatially coherent signals in such a way as to attenuate spatially white noises (i.e. totally incoherent in space). By hypothesis, the signals must be stationary or slowly evolutive. The larger the number of sensors the better the separation obtained. These processes are not applicable in magnetic detection, because the signal to noise ratio gain is too low to be satisfactory, the magnetic networks having few sensors and the useful signal is neither spatially white, nor spatially coherent.

Finally, the processing processes using statistics with orders equal to or higher than two make it possible to carry out a blind separation of a linear combination of filters of q source signals reaching N sensors based solely on the independence property of the sources. They constitute an extension of antenna processing processes to statistical orders higher than two and are still based on the signal stationarity hypothesis. Moreover, the processing of broad band signals requires significant theoretical developments. Consideration is given here to a pulse-type useful signal having a limited time extension, having non-stationary properties and of a broad band nature, which is not appropriate for these methods.

Thus, the processing processes by using statistics of orders equal to or higher than two are not suitable for the processing of magnetic networks because of the small number of sensors used and the extreme non-stationarity of the useful signal.

DESCRIPTION OF THE INVENTION

The object of the invention is to bring about the detection of a time-variable useful signal having a finite spatial extension and the separation of spatially coherent additive noises having a considerable extension compared with that of the useful signal.

To this end it proposes a process for the extraction of a time-variable useful signal of finite spatial extension by an array of N sensors, N being equal to or greater than 3, receiving said useful signal to which have been added q spatially coherent additive noises, q being less than N, said process comprising the following stages:

- a stage of acquiring unprocessed signals on the output of each sensor,
- a stage of band-pass filtering said signals in order to restrict to the frequency band of the useful signals,
- a stage of digitizing said filtered signals, characterized in that it then comprises:
- a stage of calculating space prediction error signals of the noise during which:
a) a particular sensor from the array of N sensors is chosen,
b) the remaining N-1 sensors are distributed into groups of the same size having q sensors, whereby the same sensor can belong to more than group, and one group is used for constructing a prediction error signal if the q signals of the group are independent,
c) for each admissible group of q sensors is constructed a spatial prediction of the signal of the sensor chosen in stage a) in the following way:
  q transfer functions inherent in the chosen admissible group of q sensors and the sensor chosen in stage a) are constructed with the aid of elements of intersensor transfer functions characteristic of the distribution of the noises at all times and applied respectively to the signals of the sensors of the admissible group of q sensors considered,
  the q thus constructed signals are combined for each group in order to construct the prediction signal of the sensor chosen in stage a),
d) the prediction signal of the sensor chosen in stage a) is compared by a comparison operator with the signal on the sensor chosen in stage a) in order to construct a prediction error signal on the sensor chosen in stage a),
- a stage of analyzing prediction error signals so as to carry out the detection of the useful signal and its separation from the q additive noises.

Advantageously, the analysis stage comprises:
- a stage of calculating detection indexes,
- a stage of generating, at all times a subdivision of the array of sensors into an array of sensors receiving the useful signal and noise and an array of sensors only receiving the noise, and weightings corresponding to said subdivision,
- a weighted projection stage constituted by two substages:
- a first substage of associating the thus calculated weighting with the signal of each corresponding sensor for generating N weighted signals,
- a second substage of applying an antenna processing method to the N weighted signals in order to carry out a source space/noise space separation, knowing transfer functions of the noises, the N signals of the noise space being estimates of the useful signal present in each channel of the initial signal.

Advantageously, stages a), b) c) and d) are performed simultaneously for the N sensors and the admissible groups of q sensors of the array and this takes place at all times.

Advantageously, prior to the stage of calculating the space prediction error signals of the noise, there is an estimate with respect to the characteristic transfer functions of the propagation of the noises at all times with the aid of a recording extract of the signal of the array during which each useful signal is present.

In different special embodiments one or more of the following characteristics are encountered:
- during the stage of calculating the space prediction error signals of the noise the combination of q signals is an addition,
- during the stage of calculating the space prediction error signals of the noise, the comparison of the prediction signal of the chosen sensor with the signal of said chosen sensor is a subtraction,
- during the stage of associating the weighting with the signal of the corresponding sensor, use is made of a multiplication.

The process according to the invention makes it possible to use a relevant supplementary information relative to the partitioning or subdivision of the array of sensors into two subarrays, the subarray of the noise sensors only and the subarray of the useful sensors.

The interest of this process is that it is resistant to possible subdivision errors, because it produces a mean value (property of antenna processing), unlike in the case of noise subtraction processes, which require a certain subdivision of the sensors (which is generally unavailable e.g. for magnetic networks) and which have a poor resistance to classification errors.

Compared with conventional antenna processing processes, subdivision or partition makes it possible to avoid rough errors by automatically rejecting sensors which may have received the useful signal. There is a considerable reduction (in proportions dependent on the quality of the estimator of the space prediction functions and the construction of the detection indices) of the defects due to the projection of part of the useful signal into e.g. the geomagnetic noise space. The quality of possible subsequent processings of the useful signal, such as e.g. the application of methods for locating the source of the useful signal, is therefore significantly improved.

Thus, the weighted projection controlled by the expert system is located between the noise subtraction processes, which do not have a good resistance to partitioning errors, but do have a good signal to noise ratio, and conventional antenna processing processes, which have a good resistance, but generate significant defects at the output. The process according to the invention carries out a filtering incorporating at all times the sensors which only receive noise, combining the advantage of a good signal to noise ratio at the output and a good resistance.

The invention also relates to a device for the extraction of a time-variable useful signal with a finite spatial extension from a signal incorporating said useful signal to which are added q spatially coherent additive noises and having a large extension compared with that of the useful signal, characterized in that it comprises an array of N sensors, N being equal to or greater than 3, N strictly exceeding q, said N sensors being adequately spaced so that the useful signal is unable to touch all the sensors at once, the area monitored by each sensor of the array not containing all the other sensors, said N sensors being followed by N filtering modules, N digitizing modules, a module for calculating the space prediction error signals of the noise, a module for calculating the detection indexes, a real time expert system module and a weighted projection module.

Advantageously, the array of sensors can be constituted by sensors of different types. The complementary nature of the measurements thus makes it possible to obtain a better detection of a physical phenomenon by its different effects (pressure, electromagnetic, acoustic, etc.).

Each sensor can be a "gradientmeter", i.e. can be constituted by several slightly spaced sensors of the same type and between which a difference is formed.

Advantageously, the N sensors are adequately spaced to enable the detection perimeter of each sensor of the array not to contain all the sensors at once. The maximum intersensor space can be approximately twice the range of a sensor.

The process and device according to the invention can be performed on all network signal types, provided that they can be modelled in accordance with the above-defined hypotheses. It is then possible to separate the two sources: coherent signal and incoherent signal and limited spatial extension. The expert system can be adapted to all signal types and receive a prior supplementary informations in order to supply a subdivision or partition which is as close as possible to reality. The monosensor networks of all types of sensors (acoustic, seismic, electric, pressure) can be processed. The multisensor networks (several sensor types at the same time) can be processed in accordance with a similar process.

Several useful signals of independent origins can be present on the network at the same time. The reconstructed useful signal is then the sum of the useful signals of the different sources.

It is pointed out that the notion of space coherence can exist for signals of different types. For example, a pressure signal can be linked with a magnetic signal by a linear transfer. When relations between signals do not mathematically exist or are difficult to calculate, they cannot be integrated in the matrix of transfer functions, but they can be incorporated into the expert system.

The process and device according to the invention have numerous industrial applications and in particular:
- the detection of magnetic devices moving over a given area,
- the detection of the unsatisfactory operation of sensors in a system or array,
- the monitoring of industrial sites, airports and places of passage,
- the monitoring of volcanic activity,
- checking the migration of fluids in geological structures.

BRIEF DESCRIPTION OF THE DRAWINGS

FIGS. 7A and 7B are graphs of the partition decisions for AN (p) and ANtopo(P), respectively, FIG. 8 graphs the final petition decisions for the index, target (p) for p varying from 1 to N.

DETAILED DESCRIPTION OF EMBODIMENTS

Figure 1:
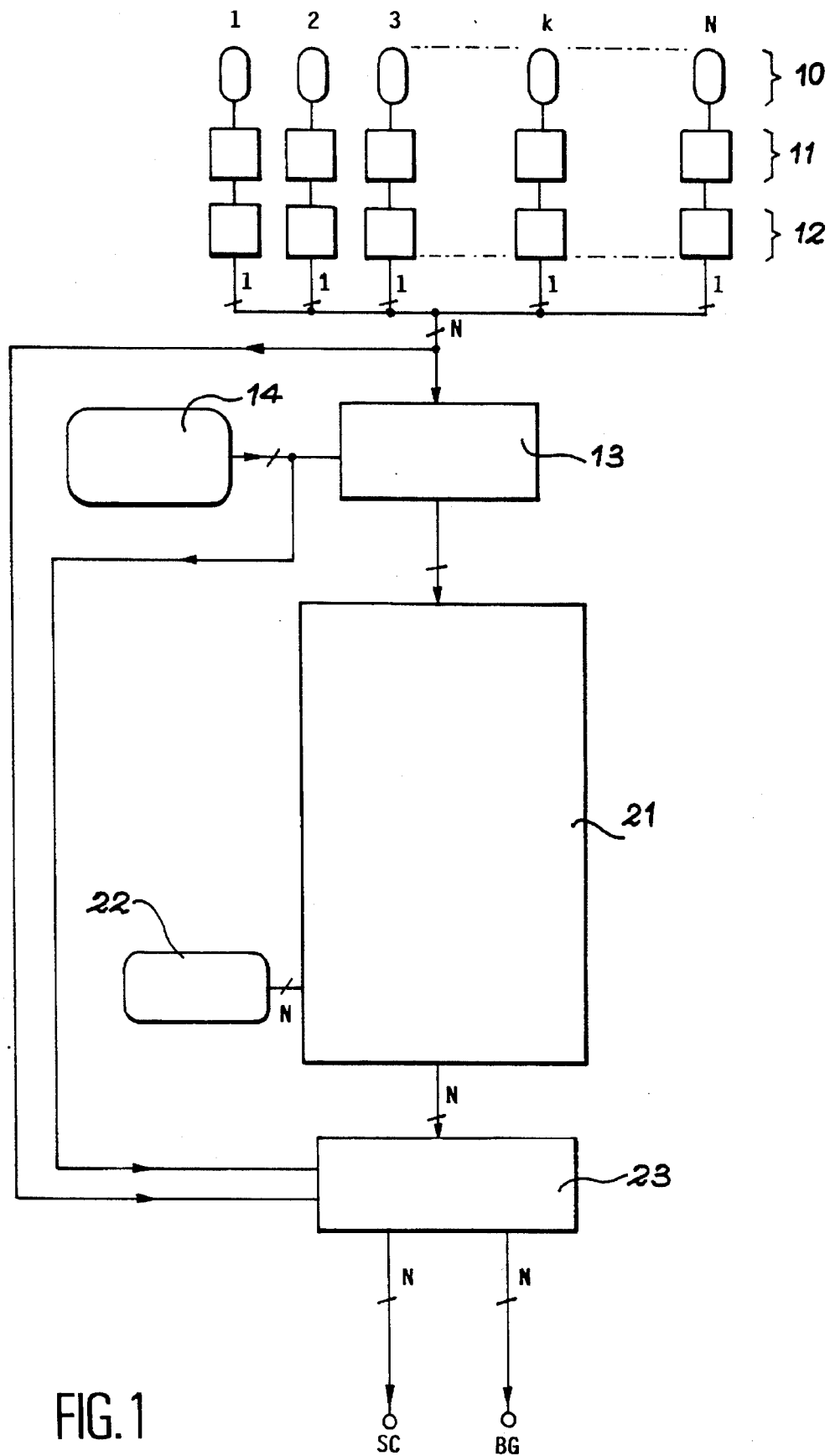
FIG. 1 is a block diagram which illustrates a device for extracting the signal according to the invention.

The object of the process according to the invention is to make it possible to process a network signal and separate one or more measurable physical phenomena in the form of a useful signal, which are optionally added to the noises of the network.

The physical phenomena involved can be of a random nature if the following hypotheses with regards to the useful signal and the noises accompanying its measurement are respected:
- the useful signal has a finite spatial extension,
- the q additive noises are spatially coherent and have a large extension compared with that of the useful signal.

The useful signal must touch a subarray $E_{su}(t)$ (the subarray being called cardinal "useful signal" v, t designating the time) of the array E of N sensors, $E_{su}(t)$ being unknown and can vary in time. The additive noises must be spatially coherent, i.e. there are combinations of signals from q sensors calculating the noise reaching the other sensors. In a particular embodiment where the transfer functions are linear filters, these transmission modes are stored in a transfer function matrix. The coherence properties can be stationary and therefore the transfer matrix is constant in time, or may be non-stationary. In the latter case, the device according to the invention must be able to access the transfer matrix, whose evolution must be calculable at all times.

The sensors can be of different types (magnetic, pressure, temperature, etc.) for the same network. A multisensor network or array makes it possible to detect a physical phenomenon by its different effects.

In the remainder of the description, for illustrating the operation of the process of the invention, consideration is given in exemplified manner to the field of the magnetic detection of mobile sources, the considered device being constituted by N magnetic sensors, which are either fixed or moving slowly and located on the area to be monitored, as well as a processing circuit. A multisensor network could complete the magnetic measurement by pressure measurements permitting a more reliable detection.

The process according to the invention makes it possible to separate the signals received on the antenna and designate the sensors which receive the useful signal. In this case the spatial coherence of the noise signals is ensured by the existence of linear prediction filters of the noise between the sensors.

A magnetic object moving in the vicinity of an array of magnetic sensors generates a useful signal, which is added to the natural magnetic signals. Close to the surface of the earth, the measured magnetic field is formed from the superimposing of vector signals generated by three sources:

- a space and time-fixed signal concerning the dimensions of the considered areas. It is roughly modelled by the field of a dipole located along an axis having a direction slightly different from that of the earth. However, finer or more accurate models exist. As a function of the required precision, the chosen model is more or less accurate. For the sizes of areas envisaged here, it is considered that said signal is constant in time and space. Its module is very large compared with the other recorded signals;
- a space only-variable signal (for the considered time intervals) generated by the local geology (local being the geology—sensor distance of the same order of magnitude as the area to be monitored) and called geological field. The movement of a sensor in this space-variable field generates a time signal called geological noise;
- a time and space-variable signal generated by ionospherical currents and called geomagnetic noise or geomagnetic fluctuation.

It is necessary to add to this list the useful signal, which is variable in time and space and whose spatial extension is smaller than the monitored area. The properties of the three sources are given in order to show that there is a network of two signals in accordance with the hypotheses made hereinbefore.

The static earth Gauss field is filtered by a high-pass filter.

It is considered here that the sensor displacement speed is sufficiently close to 0 for the largest possible frequency of the geological noise to be outside the band liable to receive the useful signal. Thus, it can be eliminated by a band-pass frequency filtering.

The third signal, i.e. the geomagnetic noise has the property of being coherent in space. Berdichevski and Zdhanov in an article entitled "Advanced Theory of Deep Magnetic Sounding" (Elsevier, 1984) e.g. demonstrate that there are intersensor transfer functions making it possible to make a space prediction on the geomagnetic fluctuations between individual locations in the area. In favourable locations, these transfer functions or linear filters are identity filters.

For the envisaged dimensions of the networks and the study frequency band, the geomagnetic noise measured at a point r is equal to the sum of the filters of two independent components of this field measured at a point r'.

Geomagnetic fluctuations are similar to the effect produced by a primary plane wave which excites a conductive medium. In the general case, q is the number of degrees of freedom of the primary wave. For example, Egbert, in a thesis entitled "A Multivariate Approach to the Analysis of Geomagnetic Array Dam" (Washington University, 1987) demonstrates that q=2 for geomagnetic fluctuations. The primary wave has two degrees of freedom in the case of plane waves. In certain practical cases and for small distances, it is standard practice to admit that the plane wave is only slightly deformed.

The geomagnetic noise is then considered as identical throughout the study space for the same time. This is a special important case of the preceding model for which the transfer functions are scalar (and not bidimensional) and unitary.

Therefore the sensors measure geomagnetic fluctuations, which have space coherence properties, as well as a possible useful signal, which can only apply to a small number of signals of the N sensors at once. The magnetic detection of mobile sources is therefore a problem in accordance with that which the invention aims to solve with q=2. The transfer function matrix can here be identified by estimating the interspectral matrix of the network, in the absence of a useful signal.

The device and process according to the invention make use of the space coherence properties of geomagnetic fluctuations, as well as the limited spatial extension property of the useful signal. Although the invention is described relative to the example of magnetic detection, it remains a general solution for problems of other natures for as long as the above-defined hypotheses concerning the signal and noises remain valid.

As shown in FIG. 1, the device according to the invention for extracting a time-variable useful signal of finite spatial extension from a signal incorporating said useful signal and to which have been added q spatially coherent additive noises, comprises an array of N sensors, N being larger or equal to 3 and strictly larger than q, followed by N filtering modules 11 and N digitizing modules 12.

A module 13 for calculating space prediction error signals of the noise receives signals from these digitizing modules 12, as well as a module 14 for storing the transfer functions. It is connected to a useful signal detection module 21, which can contain a module for calculating detection indexes, whose shape recognition, derived, integral, proportional output channels for each error signal are inputted into a real time expert system module. This module 21 also receives informations from a module 22 in which is stored the position of the sensors, which varies in time.

A weighted projection module 23 receives informations from the digitizing modules 12, the transfer function storage function 14 and the module 21 for supplying a target signal SC and a geomagnetic noise signal BG. The elementary module of an expert system for detector module 21 is more precisely shown in FIG. 2.

In order to know whether the proportional output P (channel 16) and/or derived D (channel 17) and/or integral I (channel 18) detection indexes perform a detection of a non-zero error signal for a given pair of sensors (p, i), an OR 31 receives the channels P, I, D from the module 15 corresponding to this pair. The same procedure is used for the proportional output (channel 16') and/or derived (channel 17') and/or integral (channel 18') detection indices of the pair (p,i+1). These OR gates 31 supply detection indexes A1(p,i) and A1(p,i+1) and all the pairs A1 which can be formed with the sensor of rank p, each of the indexes A1 making it possible to answer the question: is something happening on the considered pair? These OR gates 31 are connected to a "VOTE" module 32, which forms a geometrical mean supplying a detection index AN(p). The mixed lines 15 illustrate the generalization to other pairs of sensors.

N "INFER" modules 33 receive indexes AN(1) ... AN(p) ... AN(k) ... AN(N) in order to carry out an operation of type lie_court $(d)=\alpha^3/\alpha^3+d^3$, $\alpha$ being dependent on the range of the sensor and the distance d separating the sensor p from the sensor corresponding to the detection index received by the INFER module and are connected to a "JOIN" module 34 for carrying out an aggregation operation bringing about a conjunctive consensus on the input informations and supply a detection index AN_topo(p) inputted on an "INFER" module 35, topo corresponding to the interprobe distance. For this detection index $AN_{13}$ topo(p) is necessary for there to be a target, but it is not adequate (N=1 (necessary), S=0 (adequate)).

In similar way for the shape detection channel, the detection indexes $A1_1$forme(p,i) (channel 19), A1_forme(p,i+1) (channel 19'), ... A1-forme (p,N), are respectively inputted into N "INFER" modules 36 parametrized by lie_long(d)= 1-lie_court(d). The remainder of the processing is identical. Thus, there is a "VOTE" module 37, followed by a first "INFER" module 38 which, together with a second "INFER" module 38 is inputted into a "JOIN" module 39, followed by an "INFER" module 40. The "JOIN" module supplies a detection index AN_forme_topo(p) which is not necessary for there to be a target, but which is adequate (i.e. N=0 (necessary); S=1 (adequate)).

Finally, the informations AN_topo(p) and AN_forme_topo(p) are compared in a "JOIN" module 41 in order to deduce therefrom whether or not the sensor p records a target.

In order to obtain a good operation the N sensors must be positioned in accordance with certain rules.

$E_{ref}(t)$ (noise sensor group) must never be empty in order to obtain better performance characteristics. Therefore the measurements must be performed on a sufficiently large surface to enable the detection perimeter of each sensor of the array not to contain all the other sensors at once. If this condition is not fulfilled, the process tends towards conventional antenna processes. Thus, it continues to carry out a filtering, but its performance decreases and the estimated useful signals contains defects increasing in inverse proportion to the number of sensors. P The mission carried out by the sensors must be sufficiently fine to detect the useful signal over the entire monitoring area. This leads to a maximum intersensor space of approximately twice the range (maximum detection distance) of a sensor. If this condition is not respected, a source can be present on the area without generating a trace on the recorded signals.

The sensors can be of different natures for the same network or array. Each sensor can be constituted by several slightly spaced sensors and of the same nature between which the difference is formed.

The transfer function matrix is vital for the processing stages in the operational context. It consists of "teaching" or "giving" the system the transfer functions of the noise. These transfer functions represent the space coherence property of the noises. This matrix makes it possible to carry out a spatial prediction of the noise reaching the sensor i from the measurement of the noises reaching the q other sensors, forming an admissible group. In the particular case where q=1 and/or the transfer functions are linear filters, the diagonal of the matrix of the transfer functions of dimension N×N is filled with identity functions and there remain N×(N1) transfer functions fulfilling the unknown elements of the matrix. In the general case, if the transfer functions are known or calculable, they are directly injected into the transfer function module of FIG. 1 (e.g. for the magnetic detection in a tabular geological medium, q=1 and its functions are unitary. In the opposite case, the transfer functions can be identified with the aid of a propagation model and a network signal extract in the absence of a useful signal.

For example, for transfer functions of the family of linear functions, the interspectral matrix can be estimated in the manner defined in the thesis of Claudine Turcat-Latombe entitled "Detection and characterization of signals having several components on the basis of the interspectral matrix" (Scientific and Medical University and National Polytechnic Institute of Grenoble, Nov. 19, 1982). All the propagation properties of the noise are within this matrix and q could also be estimated in this stage. It is necessary to have a target-free recording time on the network sufficiently long in order to carry out a good identification of the properties of the medium.

In conclusion, this stage preceding the operational detection and filtering phase makes it possible to store the space propagation mode of the noise. In the case where the noise propagates according to a non-stationary mode, it is necessary to be able to at all times estimate the transfer function matrix.

The processing carried out on the N sensors will now be described in greater detail and is midway between the antenna processing and noise subtraction processes.

The process according to the invention comprises the following stages:

a preliminary stage 45 involving:

- a stage 42 of acquiring unprocessed signals at the output of each sensor,

- a band-pass filtering stage 43 with respect to said signals in order to bring about a restriction to the frequency band of the useful signals,

- a stage 44 of digitizing said filtered signals,

- a stage 46 of calculating the space prediction error signals of the noise during which:

a) a particular sensor is chosen from among the array of N sensors, b) the N-1 remaining sensors are subdivided into groups of the same size and having q sensors, knowing that the same sensor can belong to more than one group and admitting one group for constructing a prediction error signal if the q signals of the group are independent, c) for each admissible group of q sensors a construction takes place of a spatial prediction of the signal of the sensor chosen in stage a) in the following way:

q transfer functions inherent in the chosen admissible group of q sensors and the sensor chosen in stage a) are constructed with the aid of elements of the intersensor transfer functions characteristic of the distribution of the noises at all times and respectively applied to the signals of the sensors of the admissible group of q sensors, the q thus constructed signals are combined for each group in order to construct the prediction signal of the sensor chosen in stage a), d) the prediction signal of the sensor chosen in stage a) is compared by a comparison operator with the signal of the sensor chosen in stage a), in order to construct a prediction error signal on the sensor chosen in stage a),

- a stage of analyzing the prediction error signals in such a way as to perform the detection of the useful signal and its separation from the q additive noises comprising:

- a stage 48 of calculating detection indexes,

- a stage 49 of generating at all time a subdivision of the array of sensors into an array of sensors receiving the useful signal and the noise and an array of sensors only receiving the noise, and weightings corresponding to said subdivision,

- a weighted projection stage 50 constituted by two sub-stages:

- a first association substage for each sensor of the thus calculated weighting with the signal of the corresponding sensor for generating N weighted signals, a second substage for applying an antenna processing method to the N weighted signals in order to carry out a source space/noise space separation, knowing the transfer functions of the noises, the N signals of the noise space being the estimates of the useful signal present in each channel of the initial signal.

Advantageously, stages a), b), c) and d) can be performed simultaneously for the N sensors and the admissible groups of q sensors of the array and this takes place at all times.

During the preliminary stage 45, the N unprocessed signals are recovered at the output of the sensors, then undergo band-pass filtering in order to bring about a restriction to the band present of a possible useful signal. The filtered and digitized unprocessed signals are designated $c_k(t)$. At this stage, the signals are a sum of a possible useful signal and the geomagnetic noise.

The model of the signals received (after filtering of the first stage and after Fourier transformation) is e.g. of the magnetic detection (intersensor linear transfers):

$$C(v) = F(v)B(v) + B_{utile}(v)$$

$$= \begin{bmatrix} F_1^u(v) & F_1^v(v) \\ \cdot & \cdot \\ \cdot & \cdot \\ \cdot & \cdot \\ F_N^u(v) & F_N^v(v) \end{bmatrix} \begin{bmatrix} B^u(v) \\ B^v(v) \end{bmatrix} + \begin{bmatrix} B_{utile\,1}(v) \\ \cdot \\ \cdot \\ \cdot \\ B_{utile\,N}(v) \end{bmatrix}$$

F(v) being the matrix describing the propagation of the geomagnetic fluctuations. B(v) is the matrix of the sources, whose number q is at a maximum two (one when the primary plane wave is not deformed) and $B_{utile}(v)$ is the useful signal to be extracted.

For non-linear transfers, the relations given above are generalized by replacing the linear filtering operations by the application of transfer operators.

During the prediction error calculation stage 46, the processing uses the space coherence property of the noise. By means of a prior processing or a priori knowledge, it is assumed that the transfer functions are known. For example, for linear transfers, they can be identified by calculating the interspectral matrix formed on the array and then extracting a matrix of N-q rows by q columns called the propagator and as described in an Article by J. Munier entitled "The identification of correlated, distorted wave fronts" ("Traitement du Signal", vol. 5, no. 2, 1988) and making it possible to carry out a prediction of the signal reaching the N-q sensors from the q other sensors. It is therefore possible to predict the noise on one sensor from a group of q other sensors. The number of all the combinations of q sensors among the N possible sensors on the array is C However, only the combinations for which the q signals are not linked can supply a propagator. These unlinked groups are called "admissible groups".

For example, the geomagnetic fluctuations on the signal of the sensor k(k>q) can be predicted on the basis on the signals of the q first sensors by:

$$\hat{C}_k^p(v) = \sum_{i=1}^{q} P_{ki}^p(v) C_i(v)$$

in which $p \in [1, C_{N-1}^q]$ is an integer designating a valid combination of q sensors from among the N-1, whilst $P_{ki}^p$ designates the element of the kth row, ith column of the matrix $P^p$, said matrix designating a propagator associated with p.

This matrix $P^p$(N-q rows, q columns) can be generated for each possible grouping of q sensors among N-1, i.e. $C_{N-1}^q$ potential combinations. It is also necessary for the q signals of the pth chosen combination to be unlinked and thus forming an admissible group.

For non-linear transfers, the above expression is modified by replacing the filter $P^p$ by the operator of the intersensor transfer matrix linking the signal i with the signal k for the pth grouping of q probes.

It is therefore possible to establish a prediction error on each sensor for all the admissible groups of q sensors among N-1. It is this information which will make it possible to detect a possible abnormal operation of one sensor among N.

During the decision stage 47 for the partitioning or subdivision, a blurred partitioning method is proposed for subdividing the sensors into two groups, namely the useful sensor group $E_{su}(t)$ containing the sensors expected to receive the useful signal, i.e. those whose behaviour does not correspond to predictions, and the noise sensor group only $E_{ref}(t)$ containing the sensors appearing only to receive spatially coherent noise. It is possible to establish other subdivisions according to different criteria, but the basic principle is the same.

This information is generated by a real time expert system in the form of a coefficient $\beta(t)$ which comes closer to 1 as the sensor belongs to the noise only sensor array and closer to 0 as the sensor is expected to receive the useful signal. This decision stage comprises two successive phases, namely a phase 48 of calculating detection indexes and a partitioning phase 49 receiving at the input the signals of the intersensor space prediction errors which can be processed by a real time expert system. The first phase shapes the time error signals into an information which can be processed by the second phase, which effectively produces the decision in the form of a vector $\beta$. An example is given hereinafter of these two phases and it is e.g. illustrated by magnetic detection.

During the detection index calculating phase 48, the prediction error signals are represented by the calculating module of the detection indexes used for representing the error signals in the form of an information processable by the expert system, referred to as detection index and being significant of the existence or absence of a prediction error signal.

For example, for each error signal and at all times, a calculation takes place of four detection indexes passing out on a channel proportional to the error P, a derived channel D, an integral channel I and a shape recognition channel S. According to a known detection method described in the article by H. L. Van Trees entitled "Detection, Estimation and Modulation Theory", John Whiley & Sons, 1968, the probability that the considered signal (P, I, D or S) is non-zero can be calculated. At all times a lower threshold and an upper threshold for this probability is given and this constitutes one of the detection indexes available to the expert system. This method of describing an uncertain information by a pair of probabilities is described in the thesis of J. D. Piques (National Polytechnic Institute of Grenoble, 29.1.1992, "Expert systems in an operational context; performance optimization and uncertain knowledge processing").

This pair is formed by the minimum probability of the event and the maximum probability of the event. For example, the pair [0,1] signifies a complete ignorance, [1,1] signifies that the event is certain and [0,0] signifies a complete impossibility. The intermediate pairs to the above three extreme cases make it possible to say whether the event is "more certain", or "more impossible" and the degree of certainty of the affirmation, whereby said degree can be likened to the difference between the upper threshold and the lower threshold of probability (Cf. Thesis by J. D. Piques). If the detection index calculation module output for channel P is equal to [0.12,0.35], it is possible to deduce therefrom that the event corresponding to the zero prediction error signal of this proportional channel is more certain. An output of [0.8,0.95] signifies that this event is "more impossible" in an almost certain manner. Linguistic equivalents are supplied in the aforementioned thesis by J. D. Piques. The indexes from the channels P, I and D are mutually completed in order to establish the best possible detection conditions for a non-zero error. The index from the channel S is inherent to the detection of multipolar magnetic signals. It therefore makes it possible to carry out a detection of a multipolar signal. This information would appear to be superior to the three others, but it only supplies valid answers with a non-negligible delay.

Figure 2:
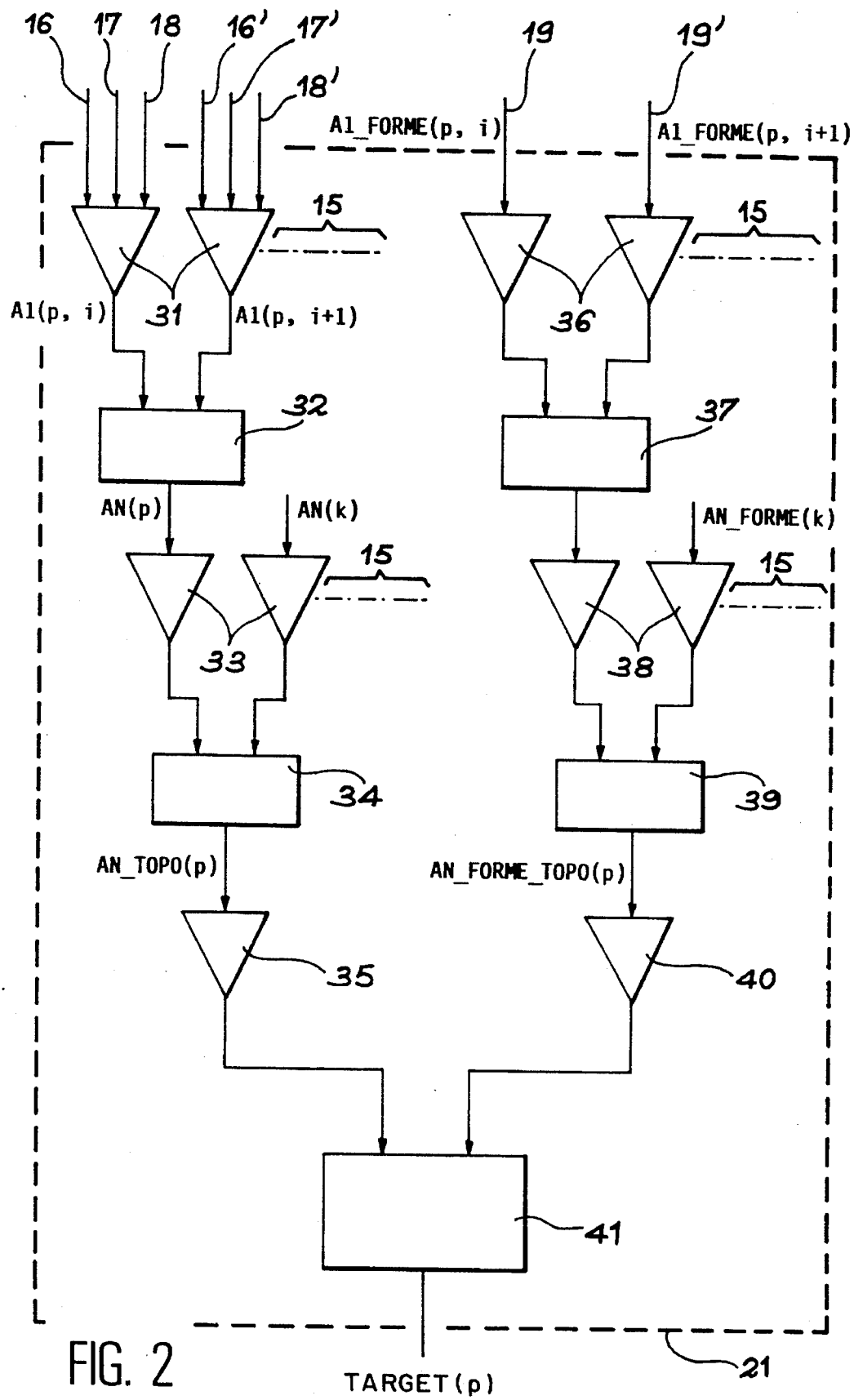
FIG. 2 illustrates an expert system module of the device according to the invention in a preferred embodiment, in the case where the transfer functions are linear and for a number of independent noises q equal to 1.
Figure 3:
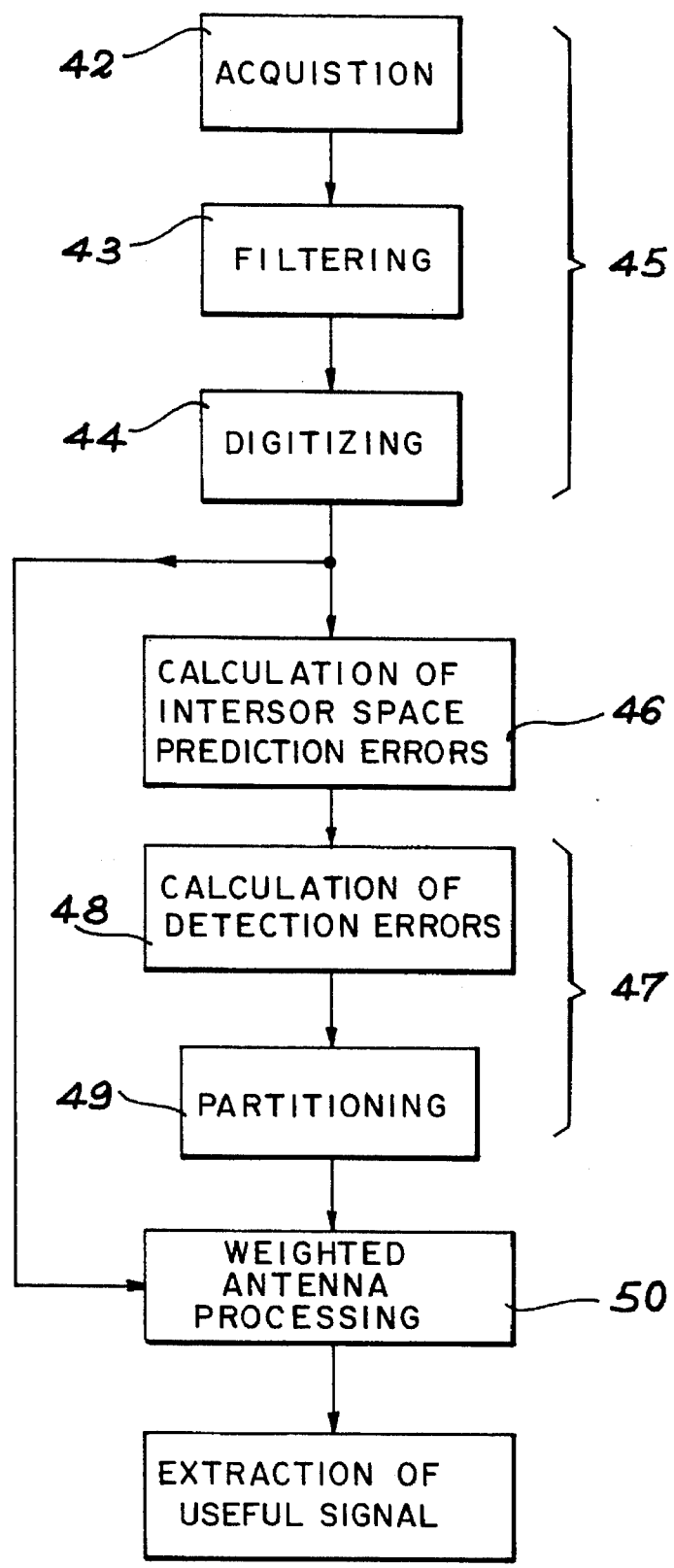
FIG. 3 is a flow chart illustrating the process of the invention.

In the partitioning or subdivision phase 49, the combination of the four detection indexes can be carried out in the manner shown in FIG. 2, which shows the real time expert system content. All the operators are described in the thesis of J. D. Piques.

Initially, the indexes of the channels P, I and D relative to the prediction error signal supplied by the pair of sensors (p,i) are combined in an OR gate (A1(p,i) in FIG. 2. A1(p,i) contains the information relative to the event: "the prediction error signal supplied by the pair of sensors (p,i) is non-zero". This stage is performed for all the error signals.

In order to deduce the behaviour of a particular sensor p, there is then a comparison of all the indexes A1(p,i) formed with the sensor p. This combination is carried out by a VOTE operator, which gives priority to the zero indexes A1(p,i). Thus, if the sensor p receives the useful signal at a time t, the prediction error signals formed with this sensor will all be non-zero. It it does not receive a useful signal, only the prediction error signals formed with signals from sensors receiving the useful signal will be non-zero.

In the second case the VOTE operator must decide whether the sensor p receives a useful signal and must be placed in the noise sensor subarray EreF. The output of this operator is AN(p). Still in the form of a probability interval, AN(p) represents the information relative to the event: "the sensor p receives a signal which is added to the noise". This signal is due to a transmission interference and/or to an operating defect of the sensor p and/or to the useful signal. The construction of AN_topo(p) takes account of the detection indexes AN(1), ... AN(N) of adjacent sensors. If the detected physical phenomenon is magnetic, it must also reach the adjacent sensors with a degree of certainty increasing in proportion to the close proximity of the sensors. For multisensor networks or arrays, the detection information on a sensor type can be taken into account at this stage in order to transmit it to another sensor type.

The informations AN(1) ... AN(N) are transformed by an INFER operation 33 "downwardly directed triangle" for carrying out the calculation of AN_topo. INFER makes it possible to give a greater weight to the detection index of a sensor as the distance between the sensor and the sensor p decreases. This operation is carried out with the aid of the lie_court(d) function, which parametrizes the INFER operator:

$$lie\_court(d) = \alpha^3/\alpha^3 + d^3$$

α being dependent on the range of the sensor, d is the distance between the sensor p and another considered sensor included in the (N-1) other sensors.

The signals obtained from the detection indexes AN(p) determined at all times and modified in this way are then compared in a JOIN operator, which performs a conjunctive consensus on the informations supplied to its input. AN_topo(p) represents the information relative to the event: "the sensor p and its neighbors receive a signal which is added to the noise".

These two final stages are performed in a similar manner for the shape detection index S. For the construction of A1_forme(p), the vote power of each prediction error signal increases as the sensors become more remote. This avoids giving importance to prediction error signals which may be formed on several sensors recording the useful signal simultaneously and which could disturb the shape detection index. This is carried out by INFER operators parametrized by the operator lie_long(d)=1−lie_court(d). The remainder of the processing is identical and AN_forme_topo(p) is constructed.

Finally, the AN_forme_topo(p) and AN_topo(p) informations are compared for calculating the detection index "get (p)" relative to the event, "the sensor p records a useful signal" following the reasoning that AN_topo(p) is necessary for the target (p) but is not adequate and AN_forme_topo(p) is adequate, but not necessary.

In conclusion, the expert system makes it possible to carry out a blurred partitioning of the sensors into two groups, the subarray of noise only sensors and the useful sensor subarray.

This information can then be translated into a single coefficient βp(t) which is closer to 1 if the sensor p belongs to the first subarray and closer to 0 if it is considered to belong to the second. In the following stage, the partitioning information βp(t) is incorporated into the weighted antenna processing module.

During the weighted projected stage 50 constituted by a weighting association substage and a substage of applying a weighted antenna processing method, the useful multipolar signal received on the antenna is not adapted to the antenna processing methods using linear filters, because it does not have space coherence. The geomagnetic fluctuations are signals belonging to a space of dimension 2 and whose power is generally greater than the useful signal to be extracted. As a result of their space coherence properties, they are adapted to conventional antenna processing hypotheses. Thus, the network signal is constituted by the sum of a space coherent signal (geomagnetic fluctuations), plus disturbances touching several sensors (the useful signal). The conventional antenna processing hypotheses are not proved here (spatially white, Gaussian, stationary noise). Everything happens as if the sensors of the useful sensor array gave very false, disturbing measurements for the conventional estimators.

During the weighting association substage, the process according to the invention attenuates the signals from the sensors belonging to the array of useful sensors by coefficients βp(t), prior to the application of the known antenna processing methods. The separation takes place by said "weighted projection" of the network signal on the signal space identified by the matrix of intersensor transfers. The projection of a network signal on the signal subspace is a well known operation, which generates defects (due to the useful signals) when applied to magnetic signals. The weighted projection makes it possible to attenuate the contribution of the sensors receiving the useful signal. Thus, all the sensors contribute to the estimation of the geomagnetic noise in the measurement of the quantity of the coefficient β associated therewith.

The weighted projection carries out the operations of:

weighting $$\tilde{c}_k(t) = \tilde{\beta}_k(t)c_k(t) \text{ ou } \tilde{\beta}_k(t) = N \frac{\beta_k(t)}{\sum_{p=1}^{N} \beta_p(t)}$$

projection on the signal subspace:

$$\hat{\beta}_p(v) = \sum_{i=1}^{q} \left( \sum_{k=1}^{N} E_{ik}^*(v)\tilde{C}_k(v) \right) E_{ip}(v) \text{ ou.}$$

$E_{ip}(v)$ is the pth component of the ith vector of the interspectral matrix, $\hat{B}_p(v)$ is the estimate of the geomagnetic noise on the pth channel, $\tilde{C}_k(v)$ is the Fourier transform of the previously obtained $\tilde{C}_k(t)$, q is the dimension of the signal subspace (q=1 or 2 for magnetic signals) and is the number of independent and spatially coherent noises, N is the number of sensors of the network.

For non-linear transfers, the above filtering operators are replaced by the operators of the matrix of intersensor transfers.

The interspectral matrix must be calculated by an estimator for a network without useful signal in order that the orientation of the characteristic vectors is not disturbed. The estimator is obtained according to methods described in the Article by J. L. Lacoume entitled "Models and processing of multidimensional signals" ("Traitement du signal", vol. 5, No. 2, 1988) and in the aforementioned thesis of Claudine Turcat-Latombe. This learning of the noise propagation properties makes it possible to construct realistic prediction filters by the construction of propagators and the characteristic vectors close to reality for projection in signal space (geomagnetic noise space as well). The quality of the estimator is vital for the correctness of the calculation of the prediction error signals and the weighted projection. In simple cases (e.g. unity transfer functions), it is not necessary to calculate the interspectral matrix and for generalization purposes it is possible to assume that the knowledge of the transfer functions is given a priori.

The notion of order in characteristic vectors is conventionally that which sequences them from 1 to N according to the decreasing size of the characteristic values associated therewith (that having the highest characteristic value is the first and that associated with the smallest characteristic value is the Nth).

Thus, the weighted projection stage 50 makes it possible to incorporate into the spatial filtering the blurred supplementary information which can be provided by the expert system concerning the subdivision of the array of sensors. This makes it possible to avoid estimation errors concerning the geomagnetic noise by reducing the influence of the useful sensors.

Figure 4:
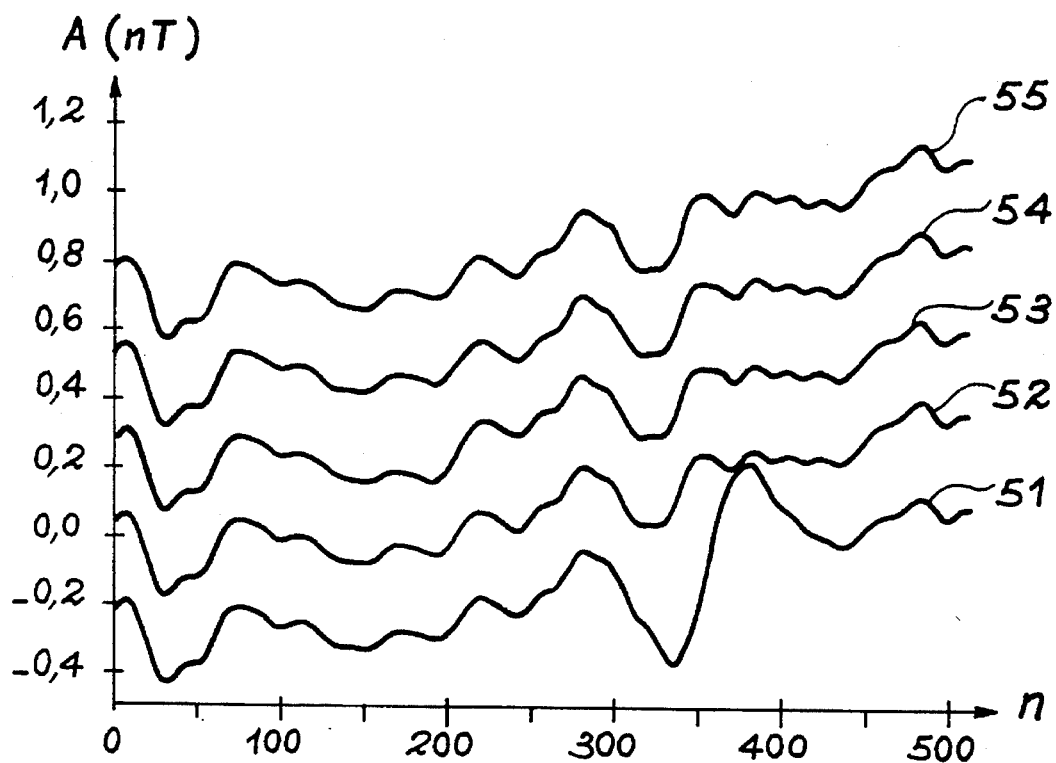
FIG. 4 is a graphical diagram showing the output signals produced by an array of five magnetic probes, as a function of the sample number n.
Figure 5:
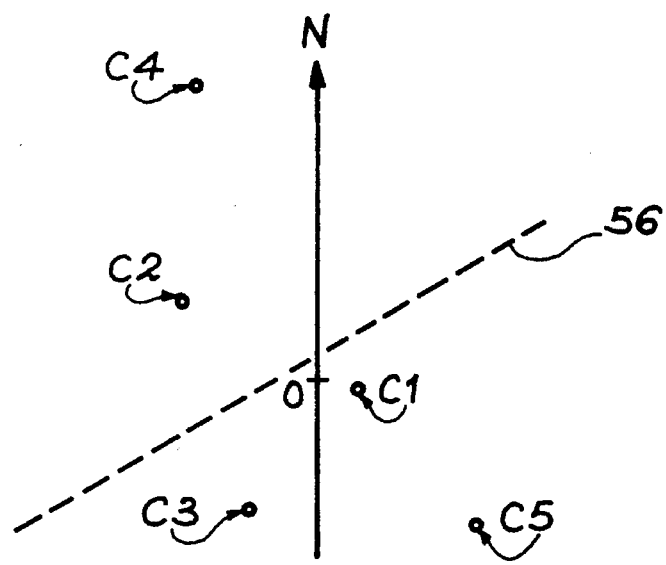
FIG. 5 is a diagram showing the geometric placement of the five probes in FIG. 4 and an exemplary dipole passage trajectory.

In a specific embodiment, the device according to the invention is applied to a magnetic network of five fixed sensors located on earth over a surface of approximately 0.25 Km². The sensors used are constituted by nuclear magnetic resonance probes for measuring the module of the field. Two groups of signals are recorded, the first being a geomagnetic noise recording only of 256 seconds making it possible to estimate the in this case very simple propagation properties of the geomagnetic noise. The second is a recording of 256 seconds superimposing the geomagnetic noise and a useful signal generated by the passage of a dipole into the field of the sensors. FIG. 4 shows the curves 51 to 55 for each of these probes of the amplitude A in nanotesla (nT) as a function of the sample number n. In FIG. 4, the different curves are displaced by ~0.25 nT, so as to be able to distinguish them, but in reality they are superimposed. This also applies with regards to the signals of FIGS. 6, 7, 8 and 9. The dipole passage trajectory 56 is shown in FIG. 5, the position of the five sensors being given in points C1 to C5, the arrow N indicating the direction north.

The processing stages are performed on the second recording with the estimator of the interspectral matrix obtained with the first group. It can be seen that here q=1 (i.e. there is only one spatially coherent noise reaching the antenna) is sufficient, because the geomagnetic fluctuations are repeated from one sensor to the next, as indicated by the interspectral matrix (a single characteristic value is non-zero over the entire studied frequency band). The propagators used are therefore identity functions and the space error signals are intersensor differences.

Figure 6:
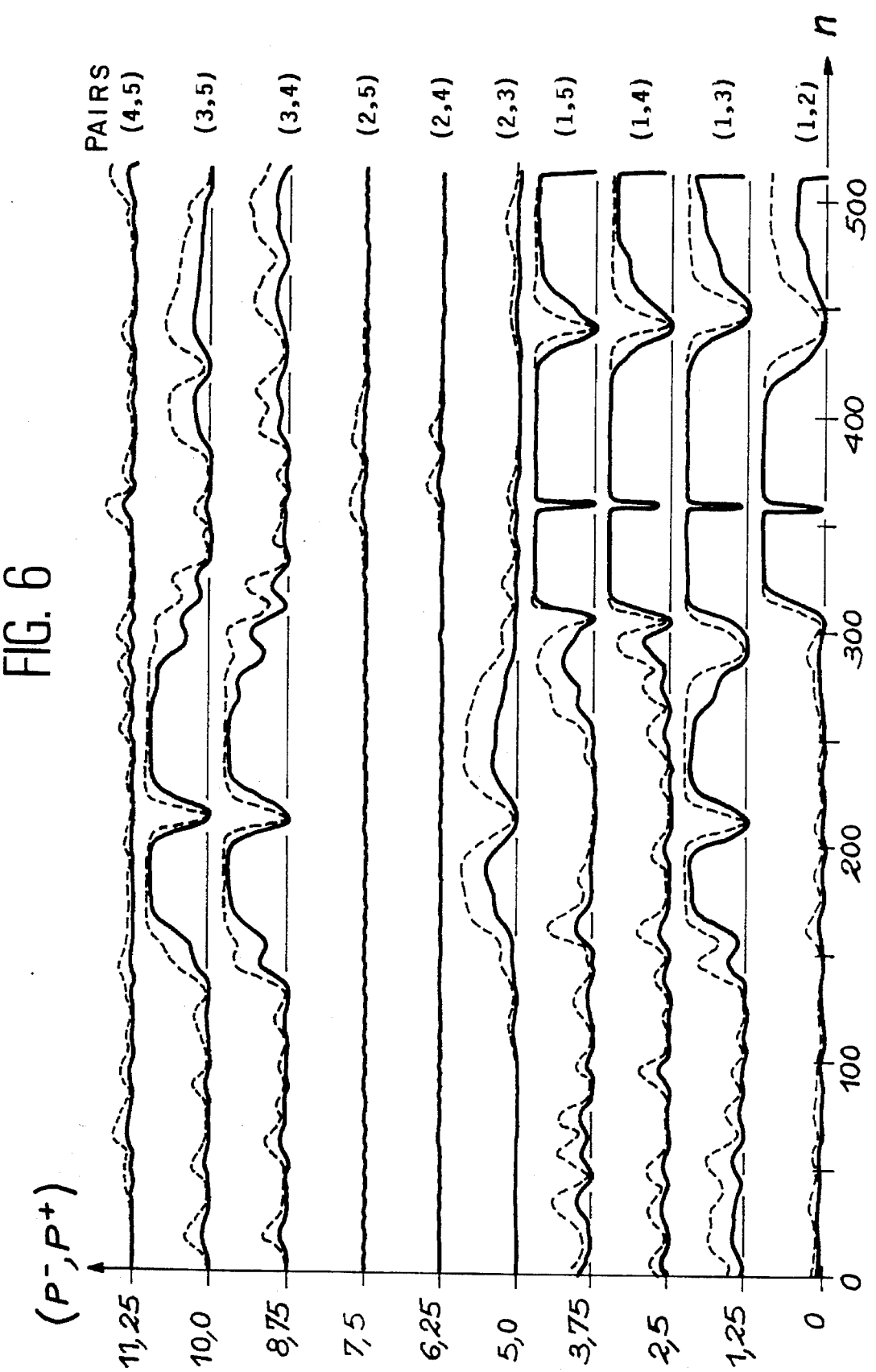
FIG. 6 graphs the upper and lower probability pairs for the signal P (channel 16 in FIG. 2)

The detection indexes P, I and D are calculated by using a model of the space prediction error signal of Gaussian probability conventionally used in detection with two standard variations, the first giving the lower probability of the event: "the prediction error signal is non-zero" and the second the upper probability of the same event. These upper and lower probabilities are calculated for the signals P, I and D. The pairs [P−,P+] are represented in FIG. 6 for the example of signals P. FIG. 6 represents the channels 16 of FIG. 2. The shape index S available here is the energy of the signal at the output of the matched filtering system. Thus, e.g. a probability model is chosen of a law of >l2 or khi two.

The detection indexes are then processed by an expert system similar to that given in FIG. 2. The partition decisions are given for AN(p) and AN_topo(p) and are shown in parts A and B of FIG. 7.

Figure 9:
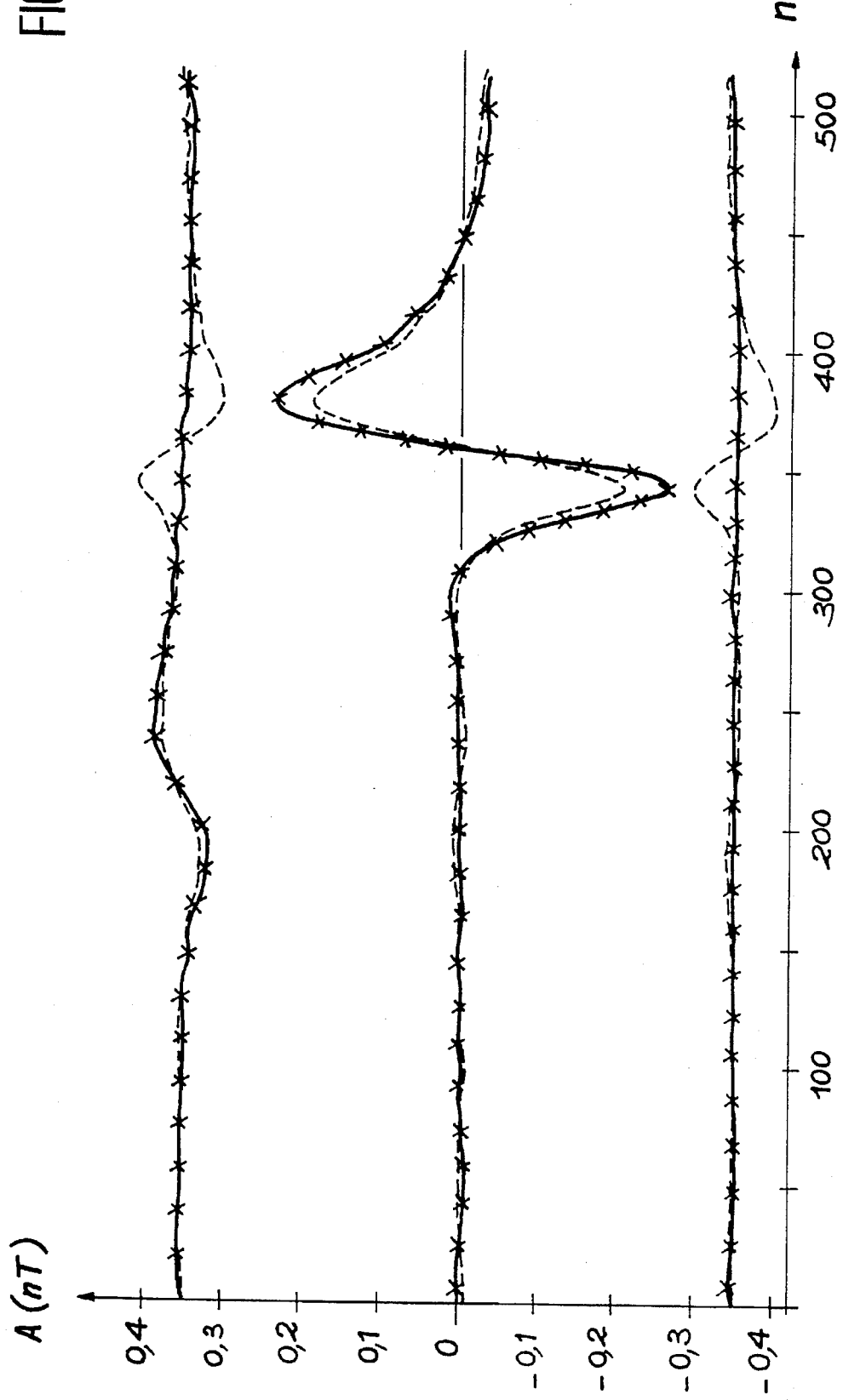
FIG. 9 is a graphical diagram comparing A (nT) as a function of the sample member n for the invention method as compared with conventional antenna processing methods.

Finally, the final partition decisions corresponding to the index, target (p) for p varying from 1 to N, which are shown in FIG. 8, are integrated into the weighted projection stage and the results are given in FIG. 9. In FIG. 9 the dotted line curves correspond to the conventional antenna processing methods and the continuous line curves to the results obtained with the invention. The curve formed from a succession of crosses corresponds to the result of the noise subtraction when the reference is known. Only three signals corresponding to the sensors 1, 2 and 3 from among the five are shown. Two of them (signals 1 and 3) receive the useful signal in visible manner. The third (signal 2) also receives a dipole signal, as shown by the channel S which supplies the multipolar detection indexes, but this is not visible to the eye. The other signals are of little interest. The results can be compared with the conventional weighting-free antenna processing method and with the signals obtained by the subtraction of the signal supplied by the probe 4, which is here considered to be a noise reference, i.e. the probe does not receive a useful signal. This noise subtraction generates the optimum signal determined on the basis of the data of the problem, such as the performance conditions with which the results can be compared. The useful signals obtained are better than those calculated by weighting-free antenna processing and the performance characteristics are almost as good as those of noise subtraction.

We claim:

1. A process for the extraction of a time-variable useful signal of finite spatial extension by an array of N sensors, N being equal to or greater than 3, receiving said useful signal from a magnetic object moving in the vicinity of this array, to which have been added q spatially coherent additive noises, q being less than N, the measurements being performed on a sufficiently large surface to enable the detecting perimeter of each sensor of the array not to contain all the other sensors at once, said process comprising the following steps:

acquiring unprocessed signals on the output of each sensor, band-pass filtering said signals in order to restrict to the frequency band of the useful signals, digitizing said filtered signals, calculating space prediction error signals of the noise during which:

a. a particular sensor from the array of N sensors is chosen, b. the remaining N-1 sensors are distributed into groups of the same size having q sensors, whereby the same sensor can belong to more than one group, and one group is used for constructing a prediction error signal if the q signals of the group are independent, c. for each admissible group of q sensors is constructed a spatial prediction of the signal of said particular sensor by constructing q transfer functions inherent in the chosen admissible group of q sensors and said particular sensor with the aid of elements of intersensor transfer functions characteristic of the distribution of the noises at all times and applied respectively to the signals of the sensors of the admissible group of q sensors considered and combining the q thus constructed signals for each group in order to construct the prediction signal of said particular sensor and d. the prediction of said particular sensor is compared by a comparison operator with the signal of said particular sensor in order to construct a prediction error signal on said particular sensor and analyzing prediction error signals so as to carry out the detection of the useful signal and its separation from the q additive noises, wherein said analyzing prediction signals comprises the steps of calculating detection indexes, and generating at all times a subdivision of the array of sensors into an array of sensors receiving the useful signal and noise and an array of sensors only receiving the noise, and weightings corresponding to said subdivision, and performing a weighted projection by associating the thus calculated weightings with the signal of each corresponding sensor for generating N weighted signals, and then applying an antenna processing method to the N weighted signals in order to carry out a source space/noise space separation, knowing the transfer functions of the noises, the N signals of the noise space being estimates of the useful signal present in each channel of the initial signal, and wherein the steps a, b, c, and d are performed simultaneously for the N sensors and the admissible groups of q sensors of the network and this takes place at all times.

2. The process according to claim 1, characterized in that prior to calculating the space prediction error signals of the noise, an estimate is made with regards to the transfer functions characteristic of the propagation of the noises at all times with the aid of a recording extract of the signal of the network during which no useful signal is present.

3. The process according to claim 1, characterized in that, while calculating the space prediction error signals of the noise, the combination of q signals is an addition.

4. The process according to claim 1, characterized in that, while calculating the space prediction error signals of the noise, the comparison of the prediction signal of the chosen sensor with the signal of said chosen sensor is a subtraction.

5. The process according to claim 1 characterized in that, during said associating the thus calculated weighting with the signal of each corresponding sensor, said signal is attenuated.

6. A device for extraction of a time-variable useful signal of finite spatial extension from a signal from a magnetic object moving in the vicinity of the device and incorporating said useful signal to which are added q spatially coherent additive noises, characterized in that said device comprises an array of N sensors, N being equal to or greater than 3 and strictly greater than q, said N sensors being followed by N filtering modules (11) and N digitizing modules (12), a module (13) for calculating the space prediction error signals of the noise, a useful signal detection module (21) and a weighted projection module (23) the measurements being performed on a sufficiently large surface to enable the detecting perimeter of each sensor of the array not to contain all the other sensors at once.

7. The device according to claim 6, characterized in that the array is constituted by sensors of different types.

8. The device according to claim 6, characterized in that each sensor can be a gradientmeter constituted by several slightly spaced sensors of the same type.

9. The device according to claim 6, characterized in that the N sensors are sufficiently spaced for the detection perimeter of each sensor of the array not to contain all the sensors at once.

10. The device according to claim 6, characterized in that the maximum intersensor space is approximately twice the range of a sensor.

* * * * *